(12) United States Patent
Joch

(10) Patent No.: US 6,400,181 B1
(45) Date of Patent: Jun. 4, 2002

(54) METHOD AND CIRCUITRY FOR THE TRANSMISSION OF SIGNALS

(75) Inventor: Christoph Joch, Eschborn (DE)

(73) Assignee: Mannesmann VDO AG, Frankfurt (DE)

( * ) Notice: Subject to any disclaimer, the term of this patent is extended or adjusted under 35 U.S.C. 154(b) by 0 days.

(21) Appl. No.: 09/622,683

(22) PCT Filed: Feb. 5, 1999

(86) PCT No.: PCT/EP99/00789

§ 371 (c)(1),
(2), (4) Date: Oct. 16, 2000

(87) PCT Pub. No.: WO99/43082

PCT Pub. Date: Aug. 26, 1999

(30) Foreign Application Priority Data

Feb. 21, 1998  (DE) .................................. 198 07 393

(51) Int. Cl.[7] ............................................. H03K 19/082
(52) U.S. Cl. ............................................. 326/75; 326/80
(58) Field of Search .............................. 326/75, 80, 89, 326/62, 82, 63; 327/333

(56) References Cited

U.S. PATENT DOCUMENTS

| | | | |
|---|---|---|---|
| 3,370,244 A | | 2/1968 | Higginbotham ........... 330/24 X |
| 3,649,851 A | * | 3/1972 | Cohen ........................ 327/333 |
| 3,868,582 A | | 2/1975 | Haferl .......................... 330/22 |
| 3,959,666 A | * | 5/1976 | Fett et al. .................... 327/333 |
| 4,764,733 A | | 8/1988 | Johnson ........................ 330/84 |
| 5,115,148 A | * | 5/1992 | Kammerl et al. ........... 327/333 |
| 5,448,183 A | | 9/1995 | Koreeda ........................ 326/33 |

OTHER PUBLICATIONS

K. Wille: "Ein schneller dc–verstärker mit Stabilisierung des Ruhe–potentials" Nuclear Instruments and Methods, vol. 72, No. 3, Aug. 1, 1969, pp. 314–316, XP002106030 Amsterdam, NL.

* cited by examiner

Primary Examiner—Tuan T. Lam
(74) Attorney, Agent, or Firm—Martin A. Farber

(57) ABSTRACT

In a method and in a circuit arrangement for transmitting signals from an output of a first circuit to an input of a second circuit, where the circuits have a first and a second operating voltage and a first and a second ground potential applied to them, and where variable potential differences can arise between the ground potentials. A current controlled by the signal which is to be transmitted flows from the output of the first circuit to a circuit point having a further potential applied to it and controls a further current, which emanates from the circuit point and is supplied to the input of the second circuit, and the further potential is chosen such that a respective voltage enabling the current and the further current is present between the output of the first circuit and the further potential, on the one hand, and between the further potential and the input of the second circuit, on the other hand, for the potential differences which arise.

9 Claims, 1 Drawing Sheet

METHOD AND CIRCUITRY FOR THE TRANSMISSION OF SIGNALS

FIELD AND BACKGROUND OF THE INVENTION

The invention relates to a method and a circuit arrangement for transmitting signals from an output of a first circuit to an input of a second circuit, where the circuits have a first and a second operating voltage and a first and a second ground potential applied to them, and where variable potential differences can arise between the ground potentials.

When signals are transmitted between two circuits having a potential offset with respect to one another, the transmitted signals may become distorted. If, as an example, a control unit in a motor vehicle is connected to a different ground point than the associated power output stage, considerable potential differences can arise, with the result that signals transmitted from the control unit to the power output stage may be distorted. The potential offset may even be a multiple of the operating voltage, with the result that even digital signals can no longer be reliably evaluated.

SUMMARY OF THE INVENTION

The object of the present invention is therefore to provide a method and a circuit arrangement for transmitting signals, in which variable potential differences which arise between the circuits do not cause distortion.

This object is achieved for the method according to the invention in that a current controlled by the signal which is to be transmitted flows from the output of the first circuit to a circuit point having a further potential applied to it and controls a further current, which emanates from the circuit point and is supplied to the input of the second circuit, and in that the further potential is chosen such that a respective voltage enabling the current and the further current is present between the output of the first circuit and the further potential, on the one hand, and between the further potential and the input of the second circuit, on the other hand, for the potential differences which arise.

In the case of the circuit arrangement according to the invention, the output of the first circuit is provided with a controllable current source whose current flows in the direction of a circuit point having a further potential applied to it and controls a further current source, which is connected to the circuit point and whose current flows in the direction of the input of the further circuit, and the further potential is chosen such that a respective voltage enabling the current and the further current is present between the output of the first circuit and the further potential, on the one hand, and between the further potential and the input of the second circuit, on the other hand, for the potential differences which arise. The potential difference which can be overcome by means of the invention is limited only by the permissible collector/emitter voltage of the transistors which at least partly form the current sources.

According to one refinement of the circuit arrangement according to the invention, a sufficient flow of current through the current sources is ensured in that the further potential is lower than the first operating voltage by at least the sum of the emitter/collector voltage of a transistor which at least partly forms the current source and whose emitter has the first operating voltage applied to it, and the base/emitter voltage of a transistor which at least partly forms the further current source, and is lower than the second operating voltage by at least the sum of the collector/emitter voltage of the transistor which forms the further current source, and the base/emitter voltage of a transistor connected to the input of the second circuit.

When transistors of a different conductivity type are used, this is achieved in that the further potential is higher than the first ground potential by at least the sum of the emitter/collector voltage of a transistor which at least partly forms the current source and whose emitter has the first ground potential applied to it, and the base/emitter voltage of a transistor which at least partly forms the further current source, and is higher than the second ground potential by at least the sum of. the collector/emitter voltage of the transistor which forms the further current source, and the base/emitter voltage of a transistor connected to the input of the second circuit.

Advantageous developments of the circuit arrangement according to the invention focus on details for the further potential in the case of respectively positive and negative operating voltages for the circuits and the use of pnp or npn transistors for the current sources.

One development of the circuit arrangement according to the invention provides that, to produce the further potential, a circuit point carrying the further potential has the ground potentials or the operating voltages applied to it via a respective diode.

If the circuit arrangement according to the invention is used in a motor vehicle, the operating voltage of the second circuit, which contains power output stages, may fail briefly. So that the power output stages can be actuated again as quickly as possible when the operating voltage returns, another development of the circuit arrangement according to the invention provides that, to produce the further potential, a circuit point carrying the further potential is connected to the operating voltage of one of the circuits via a capacitor and a first diode, and to the ground potential of the other circuit via a second diode.

A preferred application for the circuit arrangement according to the invention involves the first circuit being a control circuit and the second circuit being a power stage in an electronic motor vehicle device.

BRIEF DESCRIPTION OF THE DRAWINGS

The invention supports numerous embodiments. One embodiment of the invention is shown schematically in the drawing with the aid of a plurality of figures and is described below. In the drawing.

DETAILED DESCRIPTION OF THE PREFERRED EMBODIMENT

In the figures, identical parts are provided with identical reference symbols.

Figure 1:
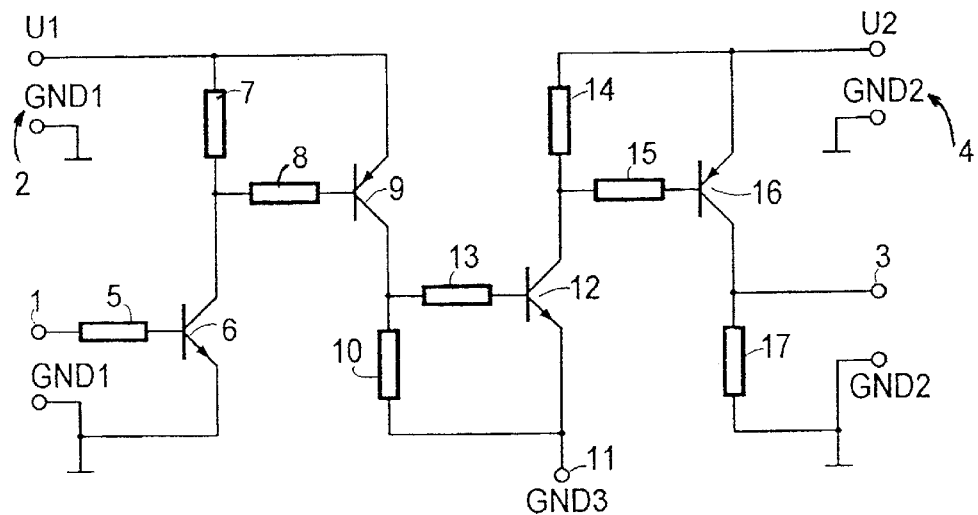
FIG. 1 shows a first illustrative embodiment having a pnp transistor as the current source.
Figure 2:
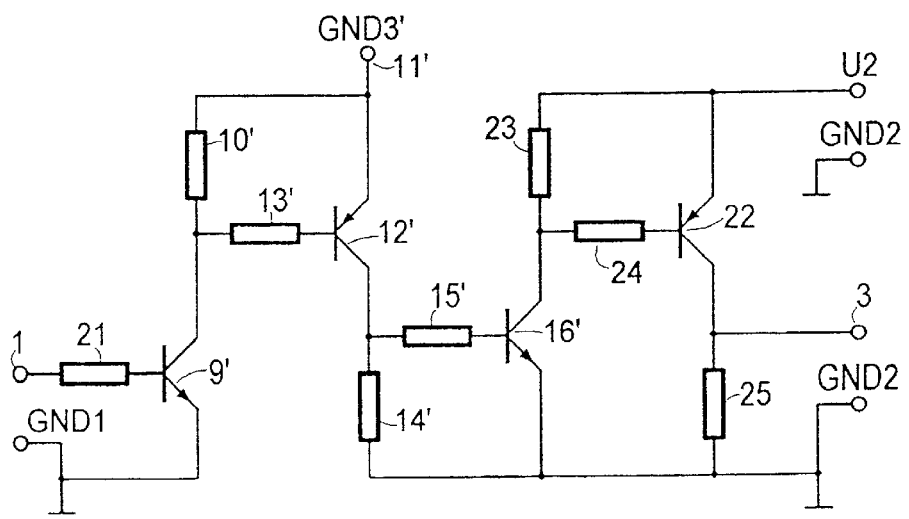
FIG. 2 shows a second illustrative embodiment having an npn transistor as the current source.

The circuit arrangements shown in FIGS. 1 and 2 can be both additionally inserted between inherently complete modules, such as control units and output stages, as well as being parts of the circuits which are to be connected. The additional-circuit design is preferable, for example, if an otherwise complete control unit, for example in the form of an integrated circuit, has a push-pull output stage. For the sake of clarity, FIGS. 1 and 2 show the circuit arrangements according to the invention independently of the circuits to be connected in each case.

The signal output by a first circuit is supplied to an input 1 and takes a ground point GND1 as reference. Like the first circuit (not shown), that part of the circuit arrangement according to the invention which is associated with this first circuit receives an operating voltage U1, which likewise takes the ground potential GND1 as reference, via a connection 2. An output 3 can be connected to the second circuit (also not shown) and carries an output signal which takes ground potential GND2 in the second circuit as reference. In addition, the circuit arrangement shown is connected to the operating voltage U2 for the second circuit via a connection 4.

In the illustrative embodiment shown in FIG. 1, the signal supplied at 1 passes via a resistor 5 to a transistor 6, whose load resistor 7 carries the signal in inverted form. A transistor 9, which forms a current source for the base current of the transistor 12 together with the resistor 13, is then connected via a further resistor 8. A resistor 10 ensures that, when the transistor 9 is off, the transistor 12 is also off. The transistor 12 forms, together with a resistor 15, a further current source, which is controlled by the collector current of the transistor 9. A resistor 14 is used for reliably turning off the transistor 16 when the transistor 12 is off. The collector current of the transistor 16 causes a voltage drop across the load resistor 17, which can be taken from the output 3 as the output signal.

If measures are now taken to ensure that, for any potential difference arising between GND1 and GND2, the potential GND3 has a value which allows a flow of current through the transistors 9 and 12, the preferably digital signals can also be transmitted. In particular, the potential GND2 must be lower than the operating voltage U1 by at least the sum of the emitter/collector voltage of the transistor 9 and the base/emitter voltage of the transistor 12, and must be lower than the operating voltage U2 by at least the sum of the collector/emitter voltage of the transistor 12 and the base/emitter voltage of the transistor 16.

Figure 3:
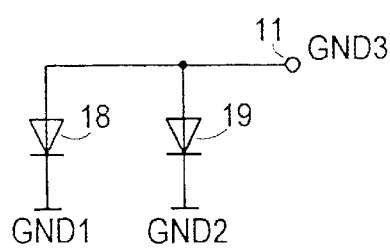
FIG. 3 shows a first circuit arrangement for producing the further potential.

However, to ensure transmission with the inherently desired amplitude for the digital signals, which is largely equivalent to the operating voltage, a potential GND3 is necessary which is essentially not above the lower of the ground potentials GND1 and GND2. Such a potential can be produced with the circuit arrangement shown in FIG. 3, which is formed from two diodes 18, 19 each arranged between GND1 and GND2, respectively, and the circuit point 11.

In the circuit arrangement shown in FIG. 2, the input 1 is connected via a resistor 21 to an npn transistor 9' operating as a current source. The voltage drop across the latter's load resistor 10' controls the further current source, formed by the transistor 12', via a resistor 13'. The signal which takes the ground potential GND2 as reference can then be tapped off across the load resistor 14' of the further current source via a resistor 15' and is supplied to the output 3 via transistors 16' and 22 provided with resistors 23, 24, 25. The further potential GND3' is supplied at 11' and should be above the two ground potentials GND1 and GND2 by at least the differences indicated above, but should preferably be at least approximately as high as the highest operating voltage.

Figure 4:
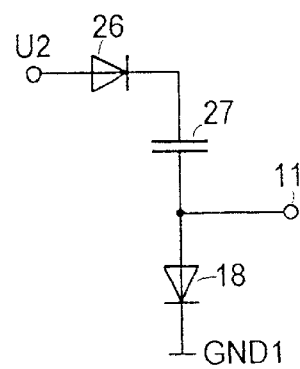
FIG. 4 shows a second circuit arrangement for producing the further potential.

When the circuit arrangement according to the invention is used in a motor vehicle, the operating voltage U2 may fail briefly. So that power output stages, which are likewise operated with U2, can be actuated again as quickly as possible when the operating voltage returns, a circuit as shown in FIG. 4 is provided to produce the potential GND3. In this circuit, the circuit point 11 is supplied with the ground potential GND1 via a diode 18, on the one hand, as in the case of the circuit shown in FIG. 3, and with the operating voltage U2 via a diode 26 and a capacitor 27, on the other hand. The result of this is that, while U2 is interrupted, GND3 assumes a negative value stored in the capacitor 27, with the result that, even when there is no operating voltage U2, the current source 12 passes on signals which are then passed on to the output 3 via the transistor 16 as soon as the operating voltage U2 has returned.

I claim:

1. A circuit arrangement for transmitting signals from an output of a first circuit to an input of a second circuit, where the first circuit has a first operating voltage and a first ground potential applied thereto, and the second circuit has a second operating voltage and a second ground potential applied thereto, and where variable potential differences arise between the ground potentials, wherein the output of the first circuit is provided with a controllable current source (9, 13; 9', 13') outputting a first controllable current which flows towards a circuit point having a further potential applied thereto, the arrangement including a further current source connected to the circuit point, the first controllable current controlling the further current source (12, 15; 12', 15') and flowing toward the input of the second circuit, and wherein the further potential is selected for enabling operation of the first controllable current source and operation of the further current source, the further potential providing a first voltage between the output of the first circuit and the circuit point, and providing a second voltage between the circuit point and the input of the second circuit for the potential differences which arise, wherein said further potential (GND3) is lower than the first operating voltage by at least the sum of emitter/collector voltage of a first transistor (9) of the controllable current source and a base/emitter voltage of a second transistor (12) of the further current source, an emitter of the first transistor having the first operating voltage applied thereto, and wherein said further potential is lower than the second operating voltage by at least the sum of the collector/emitter voltage of the second transistor (12) and a base/emitter voltage of a third transistor (16) in the input of the second circuit, wherein a collector terminal of the first transistor is connected to a base terminal of the second transistor, and the collector terminal of the second transistor is connected to a base terminal of the third transistor.

2. The circuit arrangement as claimed in claim 1, wherein the operating voltages are positive with respect to the ground potentials, wherein the first transistor of the controllable current source in the first circuit is a pnp transistor (9) and has the first operating voltage applied thereto, wherein the input of the second circuit has a resistor (14) which has the second operating voltage applied thereto, and wherein the further potential is essentially equivalent to a most negative of the ground potentials.

3. The circuit arrangement as claimed in claim 1, wherein the operating voltages are positive with respect to the ground potentials, wherein the first transistor of the controllable current source in the first circuit is an npn transistor (9') and has the first ground potential applied thereto, wherein the input of the second circuit has a resistor (14') which has the second ground potential applied thereto, and wherein the further potential is essentially equivalent to a most positive of the operating voltages.

4. A circuit arrangement for transmitting signals from an output of a first circuit to an input of a second circuit, where the first circuit has a first operating voltage and a first ground potential applied thereto, and the second circuit has a second operating voltage and a second ground potential applied thereto, and where variable potential differences arise between the ground potentials, wherein the output of the first circuit is provided with a controllable current source (9, 13; 9', 13') outputting a first controllable current which flows towards a circuit point having a further potential applied thereto, the arrangement including a further current source connected to the circuit point, the first controllable current controlling the further current source (12, 15; 12', 15') and flowing toward the input of the second circuit, and wherein the further potential is selected for enabling operation of the first controllable current source and operation of the further current source, the further potential providing a first voltage between the output of the first circuit and the circuit point, and providing a second voltage between the circuit point and the input of the second circuit for the potential differences which arise, wherein said further potential (GND3) is higher than the first ground potential by at least the sum of an emitter/collector voltage of a first transistor (9') of the controllable current source and of which an emitter thereof has the first ground potential applied thereto, and base/emitter voltage of a second transistor (12') of the further current source, and is higher than the second ground potential by at least the sum of the collector/emitter voltage of the second transistor (12') and the base/emitter voltage of a third transistor (16') in the input of the second circuit, wherein a collector terminal of the first transistor is connected to a base terminal of the second transistor, and the collector terminal of the second transistor is connected to a base terminal of the third transistor.

5. The circuit arrangement as claimed in claim 4, wherein the operating voltages are negative with respect to the ground potentials, wherein the first transistor of the controllable current source in the first circuit is an npn transistor and has the first operating voltage applied thereto, wherein the input of the second circuit has a resistor which has the second operating voltage applied thereto, and wherein the further potential is essentially equivalent to a most positive of the ground potentials.

6. The circuit arrangement as claimed in claim 4, wherein the operating voltages are negative with respect to the ground potentials, wherein the first transistor of the controllable current source in the first circuit is a pnp transistor and has the first ground potential applied thereto, wherein the input of the second circuit has a resistor which has the second ground potential applied thereto, and wherein the further potential is essentially equivalent to a most negative of the operating voltages.

7. The circuit arrangement as claimed in claim 4, wherein the first circuit is a control circuit and the second circuit is a power stage in an electronic motor vehicle device.

8. A circuit arrangement for transmitting signals from an output of a first circuit to an input of a second circuit, where the first circuit has a first operating voltage and a first ground potential applied thereto, and the second circuit has a second operating voltage and a second ground potential applied thereto, and where variable potential differences arise between the ground potentials, wherein the output of the first circuit is provided with a controllable current source (9, 13; 9', 13') outputting a first controllable current which flows towards a circuit point having a further potential applied thereto, the arrangement including a further current source connected to the circuit point, the first controllable current controlling the further current source (12, 15; 12', 15') and flowing toward the input of the second circuit, and wherein the further potential is selected for enabling operation of the first controllable current source and operation of the further current source, the further potential providing a first voltage between the output of the first circuit and the circuit point, and providing a second voltage between the circuit point and the input of the second circuit for the potential differences which arise, wherein, to produce the further potential, the circuit point (11) carrying the further potential has the ground potentials (GND1, GND2) or the operating voltages applied thereto via a respective diode (18, 19).

9. A circuit arrangement for transmitting signals from an output of a first circuit to an input of a second circuit, where the first circuit has a first operating voltage and a first ground potential applied thereto, and the second circuit has a second operating voltage and a second ground potential applied thereto, and where variable potential differences arise between the ground potentials, wherein the output of the first circuit is provided with a controllable current source (9, 13; 9', 13') outputting a first controllable current which flows towards a circuit point having a further potential applied thereto, the arrangement including a further current source connected to the circuit point, the first controllable current controlling the further current source (12, 15; 12', 15') and flowing toward the input of the second circuit, and wherein the further potential is selected for enabling operation of the first controllable current source and operation of the further current source, the further potential providing a first voltage between the output of the first circuit and the circuit point, and providing a second voltage between the circuit point and the input of the second circuit for the potential differences which arise, wherein, to produce the further potential, the circuit point (11) carrying the further potential is connected to the operating voltage of one of the circuits via a capacitor (27) and a first diode (26), and to the ground potential of the other circuit via a second diode (18).

\* \* \* \* \*